United States Patent
Ganev et al.

(10) Patent No.: US 7,595,971 B2
(45) Date of Patent: Sep. 29, 2009

(54) SENSING ARMATURE MOTION IN HIGH-SPEED SOLENOIDS

(75) Inventors: Evgeni Ganev, Torrance, CA (US); William H. Warr, Glendale, CA (US)

(73) Assignee: Honeywell International Inc., Morristown, NJ (US)

( * ) Notice: Subject to any disclaimer, the term of this patent is extended or adjusted under 35 U.S.C. 154(b) by 564 days.

(21) Appl. No.: 11/153,973

(22) Filed: Jun. 15, 2005

(65) Prior Publication Data

US 2006/0285265 A1    Dec. 21, 2006

(51) Int. Cl.
*H01H 47/00* (2006.01)
(52) U.S. Cl. .................. 361/160; 361/166; 361/167; 361/168.1
(58) Field of Classification Search .......... 361/154, 361/160, 166–168.1; 60/39.25, 39.27
See application file for complete search history.

(56) References Cited

U.S. PATENT DOCUMENTS

| | | | |
|---|---|---|---|
| 4,321,946 A | | 3/1982 | Paulos et al. |
| 4,978,058 A | * | 12/1990 | Duncan et al. ............ 236/12.12 |
| 5,053,911 A | * | 10/1991 | Kopec et al. ................ 361/154 |
| 5,148,674 A | * | 9/1992 | Morris .......................... 60/240 |
| 5,381,297 A | * | 1/1995 | Weber .......................... 361/153 |
| 5,667,285 A | * | 9/1997 | Seetharaman et al. ..... 303/116.2 |
| 5,796,261 A | | 8/1998 | Golab et al. |
| 5,825,216 A | | 10/1998 | Archer et al. |
| 5,861,746 A | * | 1/1999 | Ensten .................. 324/207.16 |
| 5,942,892 A | | 8/1999 | Li |
| 5,995,356 A | | 11/1999 | Glavmo et al. |

(Continued)

FOREIGN PATENT DOCUMENTS

DE    3624231 A1    1/1988

(Continued)

OTHER PUBLICATIONS

International Search Report dated Jul. 24, 2006.

*Primary Examiner*—Stephen W Jackson
*Assistant Examiner*—Terrence R Willoughby
(74) *Attorney, Agent, or Firm*—Oral Caglar, Esq.

(57) ABSTRACT

The invention relates to a technique for discerning a status of an armature of a high-speed solenoid at any time during its operational cycle. In high speed solenoids, motion of an armature does not occur until after a finite and indeterminate lapse of time after application of a driving voltage.

In the present invention, a pulsed driving voltage is used to drive the solenoid. A resultant current in a coil of the solenoid exhibits discontinuities in its rate of change when the armature moves. Occurrences of the discontinuities are used to produce control signals and coordinate operation of the solenoids and other controllable events. Occurrence of these discontinuities exactly correlates with armature motion. Consequently, time lapse between application of voltage and motion of the armature becomes inconsequential in design of a control system. In other words, control and coordination of operation of high-speed solenoids can be performed without consideration of uncertainties of the time lapse.

In an exemplary illustration, the invention is applied to controlling speed of a turbine generator of a type used in space vehicles. High-speed solenoids are used to control bursts of hydrogen and oxygen flow into a combustion chamber of the turbine generator. Speed control is maintained by controlling a rate and duration of the bursts.

8 Claims, 6 Drawing Sheets

U.S. PATENT DOCUMENTS

| | | |
|---|---|---|
| 6,208,497 B1 | 3/2001 | Seale et al. |
| 6,300,733 B1 | 10/2001 | Bergstrom |
| 6,476,599 B1 | 11/2002 | Czimmek et al. |
| 7,271,993 B2 * | 9/2007 | Plojhar et al. ............... 361/154 |
| 2002/0088956 A1 | 7/2002 | Hidetaka et al. |

FOREIGN PATENT DOCUMENTS

| | | |
|---|---|---|
| EP | 1109178 A | 6/2001 |
| FR | 2845162 A1 | 4/2004 |
| JP | 407187566 A  * | 7/1995 |
| WO | WO 2004102600 A | 11/2004 |

* cited by examiner

SENSING ARMATURE MOTION IN HIGH-SPEED SOLENOIDS

BACKGROUND OF THE INVENTION

This invention generally relates to methods reliably detecting a position of an armature of a high-speed solenoid and more particularly to detecting when the armature moves.

There are many applications in which it is desirable to employ high-speed solenoids, i.e., solenoids with a cycle period less than 30 milliseconds, to perform control functions. These so-called high-speed solenoids may be distinguished from low speed solenoids by consideration of their respective electrical and mechanical time constants.

High speed solenoids have mechanical time constants that are lower than their electrical time constants. In other words, the armature of a high speed solenoid moves so rapidly that, comparatively, the time during which motion occurs is only a small fraction of the total time needed to produce a coil steady-state operating current.

It is difficult to discern exactly when, in time, an armature of a high-speed solenoid moves. A typical solenoid driving circuit requires some finite time to develop sufficient current to move an armature. Typically the armature motion may begin at some indeterminate time after initiation of the current buildup. For example, motion of the armature may begin 1.2 milliseconds after application of a driving voltage or such motion may begin 1.7 milliseconds after the application of the voltage. In the context of low-speed solenoids, an error of position discernment of a millisecond or less is inconsequential. But in the context of high-speed solenoids, such an error in motion discernment substantially reduces the utility of the solenoid.

In the prior art, sensing circuits have been devised to detect motion of an armature of a solenoid. These prior art circuits detect discontinuities in coil-current change and correlate these discontinuities with changes in motion of an armature of a solenoid. One example of such a system is described in U.S. Pat. No. 5,995,356 (Glavmo, et. al.). In Glavmo, fuel injectors for an engine are operated in a synchronous relationship with a solenoid operated control valve. A detection circuit determines the times at which the valve reaches its open position and its closed position. The circuit detects discontinuities of current change in an operating coil of the solenoid. A unique discontinuity develops when the valve reaches its open position and a different discontinuity develops when the valve reaches its closed position.

Sensing circuits such as those described in Glavmo, require a very precise matching of coil inductance and timing of application of driving voltage. In other words, any particular solenoid must be matched with a particular timing of application of driving voltage. Only with proper matching will measurable current-change discontinuities occur when an armature of the solenoid reaches one of its end points. If driving voltage is applied too early or too late, discontinuities are smoothed out and become undetectable.

This is an acceptable constraint in solenoid valves for fuel injection systems such as those disclosed in Glavmo. These valves typically have duty cycles with periods in excess of 2000 to 3000 milliseconds. Such constraints are not acceptable in the operation of high-speed solenoids. It is impracticable to match driving voltage application timing with a particular inductance of a coil of a high speed solenoid. High speed solenoids operate with duty cycles having periods that are orders of magnitude less than the valves described in Glavmo, i.e. 30 milliseconds or less as compared to 2000 to 3000 milliseconds.

In another prior art sensing technique, separate sensors are employed along with high-speed solenoids to accurately determine when an armature moves. But, there are certain applications in which it is impracticable to employ a separate sensor to accurately discern armature motion. For example, use of separate sensors is undesirable in the context of space vehicles, because the sensors add weight to a vehicle and because they contribute to a reduced system reliability of the vehicle.

In some prior art applications, particularly high voltages are used to activate high speed solenoids. Higher voltages provide more rapid coil current rise to a steady state and consequently a tighter relationship between a time of application of a voltage and a time of movement of an armature. But, high voltage solenoids are larger and heavier than solenoids designed to operate with lower voltages. Increased weight in an aircraft or a space vehicle is an obvious disadvantage. Additionally, higher operating voltage may create undesirable corona effects.

An example of some difficulties which arise from these prior art shortcomings can be understood by considering the operation of turbine generators used in space vehicles. Solenoids are used to control intermittent bursts of oxygen and hydrogen flow into a combustion chamber of a turbine generator. Speed of the turbine generator is maintained at a desired rate by coordinating operation of solenoid valves to deliver proper amounts of these gases to produce a level of energy that corresponds to a varying electrical load on the turbine generator. This coordination must be particularity precise in order to assure that hydrogen is always present in a combustion chamber before oxygen is introduced to the chamber.

As electrical loads on the turbine generator vary, these bursts of gas flow must occur for varying lengths of time. In this context it is imperative to know, at any relevant time, whether a solenoid operated valve is in an open or closed state.

These turbine generators could not heretofore be operated at a single optimum speed. Changes in bursts of hydrogen and oxygen could not be made rapidly enough to compensate for variations in electrical load on the generator. Consequently, these turbine generators were operated with a relatively wide range of speeds. A low end of a speed range developed under high load conditions and a high end of the speed range developed under low load conditions.

Operating turbine generators with a wide speed range is inefficient. Such turbines consume an excess amount of fuel. By employing high-speed solenoid valves with improved correlations of action, it would be possible to attain a narrowing of a speed range of these turbine generators and thereby improve their efficiency. But this must be accompanied with an ability to determine the state of a valve at any given time. Such an improvement has heretofore required use of separate position sensors on the valves or high-voltage solenoids to actuate the valves. Use of separate position sensors or high-voltage solenoids are undesirable in the context of a space vehicle because they add weight to a vehicle and, because they contribute to a reduced reliability of the vehicle. Additionally, high voltages may create a corona hazard. In this setting it would is desirable to use current-change discontinuity measurement in a timing system to correlate operation of these valves.

As can be seen, there is a need for simple and accurate method and apparatus for discerning the state of an armature in a high-speed solenoid that is used as an actuator. Such a need for this method and apparatus also includes a need to avoid use of separate armature position sensors.

SUMMARY OF THE INVENTION

In one aspect of the present invention a method for discerning motion of an armature in a high-speed solenoid comprises the steps of applying a pulsed driving voltage to a coil of the solenoid, measuring a resultant current in the coil, and detecting a discontinuity in a rate of change of the current, which discontinuity is produced from motion of the armature.

In another aspect of the present invention a method of sequentially operating a solenoid so that each sequence of its operation comprises the steps of applying a pulsed driving voltage to a coil of the solenoid measuring a resultant current in the coil, detecting a first discontinuity in a rate of change of the current, which first discontinuity is produced from a first motion of the armature, releasing the driving voltage from the coil of the solenoid, measuring a resultant current in the coil, and detecting a second discontinuity in a rate of change of the current, which second discontinuity is produced from a second motion of the armature.

In yet another aspect of the present invention a method for coordinating operation of a high-speed solenoid with a controllable event comprises the steps of applying a pulsed driving voltage to a coil of the solenoid, measuring a resultant current in the coil, and detecting a discontinuity in a rate of change of the current, which discontinuity is produced from motion of the armature. A control signal produced from said detection is employed to initiate the controllable event.

These and other features, aspects and advantages of the present invention will become better understood with reference to the following drawings, description and claims.

DETAILED DESCRIPTION OF THE INVENTION

Figure 1:
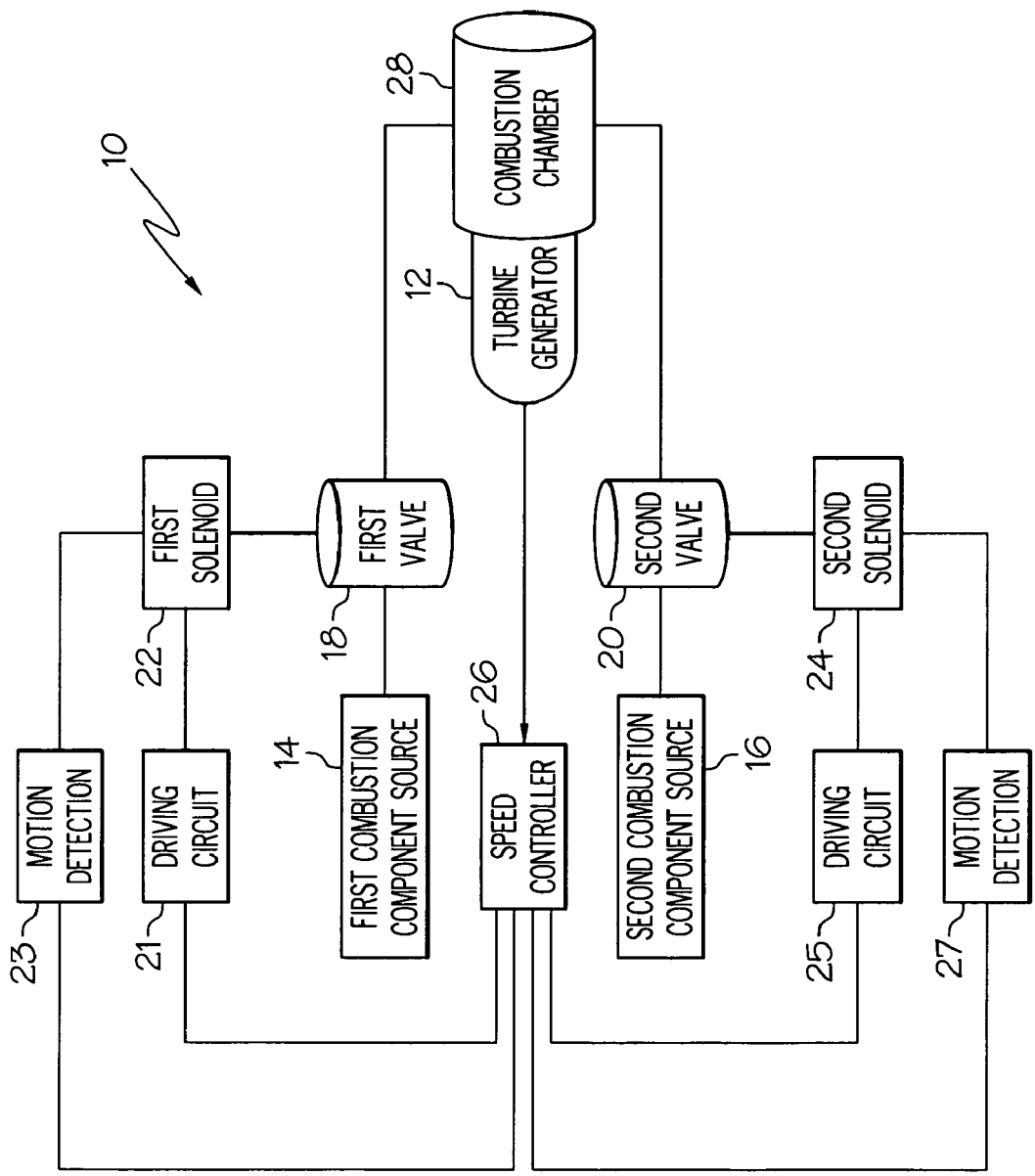
FIG. 1 is a schematic illustration of a speed control apparatus for space vehicle turbine generator which embodies an exemplary application of the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

The invention may be useful for solenoid actuators that are employed in conditions which demand simplicity of construction, low weight and high reliability. In that regard the invention is particularly useful in aircraft and space vehicle actuators. For illustrative purposes, the following description includes an example of the inventive apparatus and method that may be employed in controlling a speed of a turbine generator of a space vehicle. However, it is understood that other applications can be substituted for the turbine generator example.

The invention may provide accurate information about the status of an armature of a high-speed solenoid at any relevant time. Solenoids are generally employed to drive various types of actuators. High-speed solenoids often find application in mechanisms that require precisely timed correlation between various events. For example, a high-speed solenoid operated actuator may be required to move an object or release a fluid in coordination with motion of another object or release of another fluid. These coordinated events may occur within a few milliseconds on one another. The present invention may provide accurate information about a status of an armature of a solenoid even though motion of the armature may lag an application of a driving voltage to a coil of the solenoid. Accurate information about an exact time of motion of an armature may provide for an opportunity to precisely coordinate the armature motion with another event. Accurate armature location information may be provided by the present invention even without employment of prior art separate sensors and this may improve reliability and reduce weight and complexity of solenoid-actuated systems.

The present invention may overcome a need for separate sensors by measuring current-change discontinuities that develop when armatures move. The inventive measurement technique may be particularly effective because there may be no need to perform an impracticable matching of coil inductance with driving voltage timing. A need for matching may be avoided because the present invention may employ a pulsing voltage to drive the armature. The pulsing voltage may produce current that exhibits particularly acute discontinuities in its rate of change when an armature moves. These acute discontinuities may not be smoothed out when timing of applied voltage is not matched with a particular inductance of a solenoid.

Additionally, use of current-change discontinuity measurement may permit use of a lower driving voltage. Use of the invention may preclude a need to rapidly drive up the operating current of a solenoid in an attempt to more closely correlate a time of voltage application with a time of armature motion.

Referring now to FIG. 1, there is shown a speed control apparatus 10 for controlling speed of a turbine generator 12. The speed control apparatus 10 is one example of an application in which the present invention has utility. The turbine generator 12 may be connected to two sources of combustion components, a first source 14 which may be a hydrogen source and a second source 16 which may be an oxygen source. Interposed between the turbine generator 12 and the first source 14 may be a first valve 18. Similarly, a second valve 20 may be interposed between the generator 12 and the second source 16. Each of the valves 18 and 20 may be individually controlled by a first valve solenoid 22 and a second valve solenoid 24 respectively. A speed controller 26 may be provided to coordinate operation of the solenoids 22 and 24. A first valve driving circuit 21 and a first valve armature motion detection circuit 23 may be interposed between the first valve solenoid 22 and the speed controller 26. Also a second valve driving circuit 25 and a second valve armature motion detection circuit 27 may be interposed between the second valve solenoid 24 and the speed controller 26. Each of the motion detection circuits 23 and 27 may be adapted to provide signaling to the speed controller 26, the signaling being indicative of motion of the armatures of the solenoids 22 and 24 respectively. The speed controller 26 may be adapted to respond to armature motion signaling and provide coordinated driving signals to the valve driving circuits 21 and 25.

The turbine generator 12 may be designed to operate at an optimum speed. However, varying electrical loads may be applied to the turbine generator 12. It may therefore be difficult to maintain a speed at an exact optimum. Consequently, predetermined upper and lower speed limits are established to allow for a range of speeds.

The speed controller 26 may maintain speed of the turbine generator 12 within the preselected limits. A combustion cycle may be initiated whenever the speed controller 26 determines that speed of the turbine generator 12 may be lower than the predetermined lower limit. By way of example, the combustion components may comprise hydrogen and oxygen. For each of these exemplary combustion cycles, a burst of hydrogen may be introduced to a combustion chamber 28 incorporated in the turbine generator 12. After hydrogen is in the combustion chamber 28, oxygen may be introduced and combustion may occur. A resultant expansion of the combustion products in the combustion chamber 28 may produce forces which drive the turbine generator 12. Combustion may continue until the speed controller 26 senses that the speed of the turbine generator 12 has reached its predetermined upper limit.

It is imperative that there may never be oxygen present in the combustion chamber 28 without hydrogen also being present. If oxygen were to be present without hydrogen, rapid overheating would occur resulting in damage of the combustion chamber 28. Consequently, every combustion cycle must occur with a properly sequenced series of valve operations.

A combustion cycle may begin when the first valve solenoid 22 opens the first valve 18. After the first valve 18 is open, the second valve 20 may be opened by actuation of the second valve solenoid 24. The second valve 20 may remain closed until the controller 26 confirms that the first valve 18 is open. A combustion cycle may end when the second valve 20 closes. After the speed controller 26 confirms closure of the second valve 20, the first valve 18 may be closed. This sequencing of valve operations and confirmations assures that there may never be a presence of oxygen in the combustion chamber 28 without a presence of hydrogen in the combustion chamber 28.

Timing of valve sequencing may be critical to a proper operation of the turbine generator 12. It may be desirable to control speed of the turbine generator 12 as closely as possible to its optimum design speed. Efficiency of the turbine generator 12 may be reduced at any speed other than the optimum speed. Consequently, it may be desirable to maintain only a narrow band of speed range between the predetermined upper and lower speed limits. Maintaining a narrow band of speed ranges may require an ability to begin and end combustion cycles at short intervals. In other words, the shorter the combustion cycle interval, the more accurately may speed be controlled.

Timing of intervals between combustion cycles may be a function of an ability of the speed controller 26 to properly and rapidly sequence operation of the valves 18 and 20. Sequencing of valve operations may only proceed as fast as information about valve status becomes available to the controller 26. Typically driving current for the first valve solenoid 22 may build up for an indeterminate time before its armature begins moving. The present invention may produce accurate information of the exact time that the armature of first valve solenoid 22 begins its motion to release hydrogen. Provided with this accurate information, the controller 26 may safely initiate operation of the second valve 20 as soon as motion of an armature within the first solenoid 22 is detected. There may be no need to incorporate an uncertainty factor into valve sequencing to account for variations in time of current build-up. Thus the interval between combustion cycles may be reduced and speed of the turbine generator 12 may be held within tighter limits.

Figure 2:
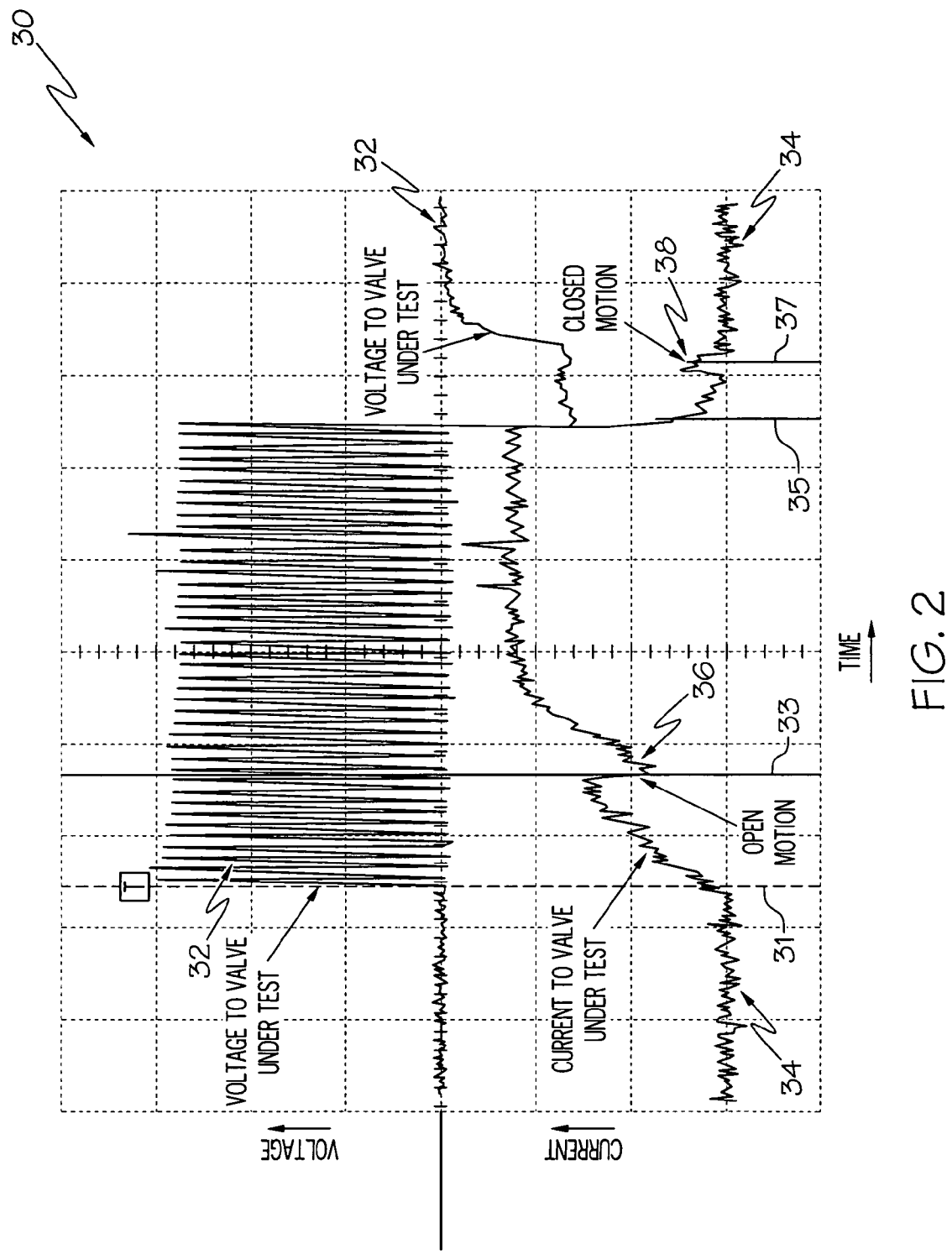
FIG. 2 is a graph which displays a relationship between operating voltage and resultant current in a coil of a solenoid which is operated in accordance with the present invention.

This utility of the present invention may be better understood by referring to FIG. 2. FIG. 2 shows a graph 30 portraying a relationship between voltage and time and a relationship between current and time. A graph line 32 displays a driving voltage vs. time relationship that may be typically applied to the first and/or second valve solenoids 22 and 24 of FIG. 1 for one sequence of its operation. A graph line 34 displays a resultant current that develops in a coil of a solenoid to which the driving voltage 32 may be applied. One sequence of operation occurs within a time period of between 2 and 5 milliseconds in this exemplary illustration.

A pulsing voltage may be applied to a solenoid coil at a time designated by the numeral 31. Typically the pulsing voltage may be applied at a frequency of between about 5 KHz and about 10 KHz. The current represented by the graph line 34 begins to increase at 31. At a time designated by the numeral 33, the current may become sufficiently high as to produce movement of an armature in one of either of the first and/or second valve solenoids 22. 24. A discontinuity 36 of current change may be manifested at time 33. This observable discontinuity 36 occurs simultaneously with an opening of one of either the first valve 18 or second valve 20 of FIG. 1.

The graph line 32 represents a cessation of the pulsed driving voltage at a time designated by the numeral 35. At time 35, there may begin a rapid decay of the resultant current shown by graph line 34. At some later time designated by the numeral 37, a discontinuity 38 of current change may occur. This discontinuity 38 may occur simultaneously with armature motion that produces closure of one of either the first valve 18 or second valve 20 of FIG. 1.

It can be seen that irrespective of how much time elapses between 31 and 33, and between 35 and 37 motion of the armature occurs at times 33 and 37. Consequently, there may be no need to know the time interval 31 to 33 or the time interval 35 to 37.

As compared to prior art high-voltage driving circuits, a reduced voltage may be used to drive the solenoids 22 and 24. High driving voltages have been used in the prior art to shorten a time interval between application of a voltage and movement of an armature. But, solenoids constructed to tolerate higher driving voltages may be larger and have a greater weight than solenoids operated with lower voltage. In the present invention, the time interval 31 to 33 and the time interval 35 to 37 may not need to be short. Consequently, a lower driving voltage may be used. Smaller and lighter solenoids may actuate the valves 18 and 20. The concept of a relatively low driving voltage is illustrated in the graph 30. The graph line 34 portrays a mode of operation that uses a relatively slow rate of current build-up. A current build-up time interval, 31 to 33, is between about 15% to about 30% of an overall time interval of a complete sequence of operation, i.e., a time interval 31 to 37. In other words, the current build-up time is between about 15% to about 30% of a period of a duty cycle of the solenoid.

It can be seen that discontinuities 36 and 38 are distinct. Their distinctive nature may differ from current change discontinuities observed in the prior art. The discontinuities 36 and 38 may remain distinct and readily detectable irrespective of any relationship between inductance of a solenoid and timing of application and release of driving voltage. This acute nature of the discontinuities may be a product of applying driving voltage in a pulsing mode.

Figure 3:
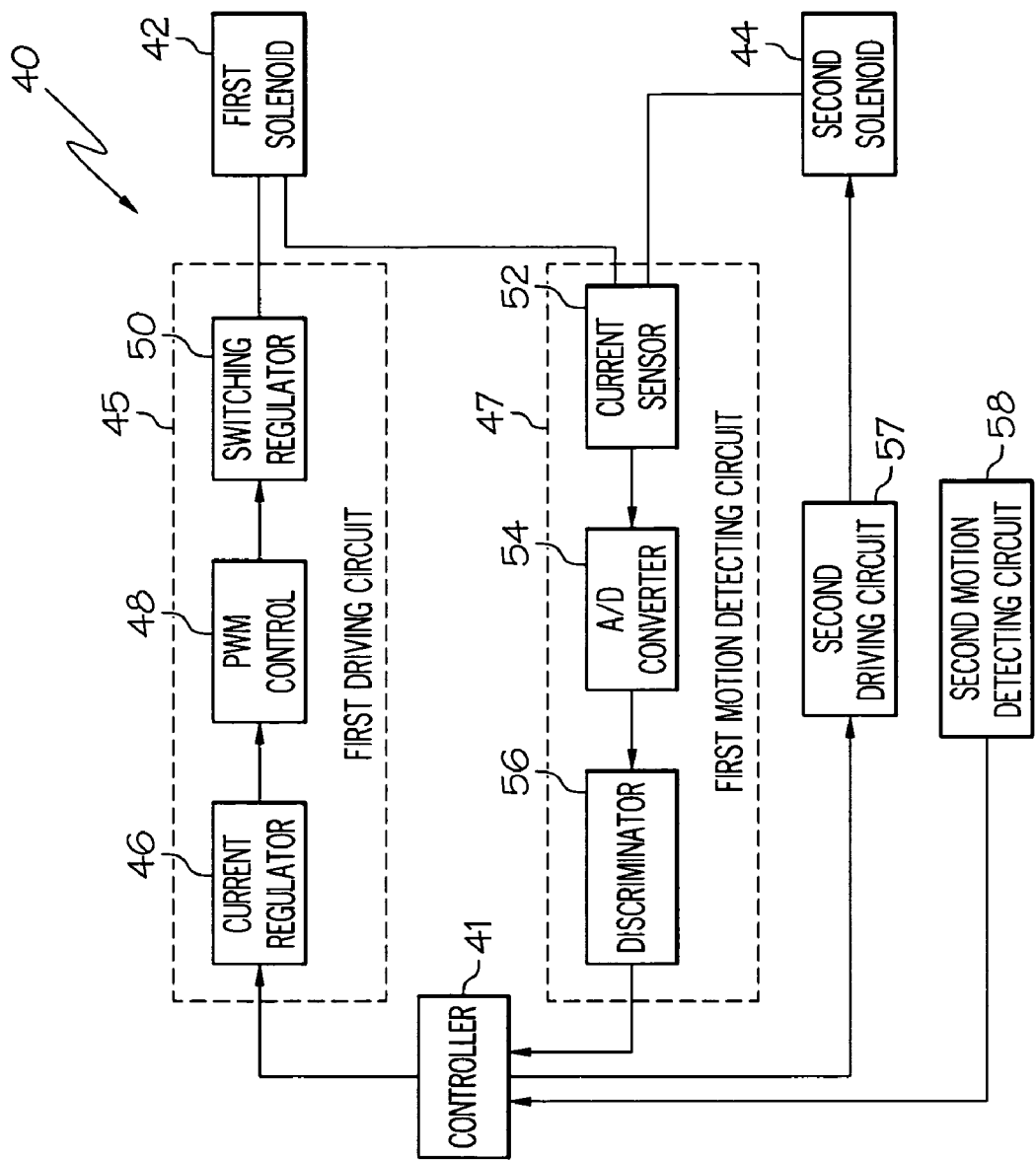
FIG. 3 is a schematic diagram of a solenoid coordination circuit constructed in accordance with the present invention.

Referring now to FIG. 3, there is shown a solenoid coordinating circuit designated generally by the numeral 40. Operation of a plurality of solenoids may be coordinated by the circuit 40. The coordinating circuit 40 of FIG. 3, for purposes merely of illustration, may portray coordination between a first high-speed solenoid 42 and a second high-speed solenoid 44. It should be understood however that coordination of any number of solenoids may be performed with the solenoid coordinating circuit 40. The circuit 40 illustrated in FIG. 3 is one type of solenoid coordinating circuit which may be used in conjunction with the controller 26 of FIG. 1.

The solenoid coordinating circuit 40 may comprise a controller 41, first and second solenoid driving circuits designated 45 and 57, respectively and first 47 and second 58 armature-motion detecting circuits. The first solenoid driving circuit 45 may comprise a current regulator 46, a Pulse Width Modulation (PWM) control 48, and a switching regulator 50. These three circuit elements, 46, 48 and 50, collectively act to provide pulsed driving voltage to the first high-speed solenoid 42. The pulsed driving voltage is of the type shown in FIG. 2. This collection of elements is referred to herein as the first solenoid driving circuit 45.

The first armature-motion detecting circuit 47 may comprise a current sensor 52, an analog to digital (A/D) converter 54 and a discriminator 56. The current sensor 52 may measure current passing though a coil of the first high-speed solenoid 42. The current information may be translated into digital form by the A/D converter 54 and the discriminator 56 may identify, in digital format, discontinuities in current-change rate. This collection of circuit elements, 52, 54, and 56 is referred to herein as the first armature-motion detecting circuit 47.

A similar collection of circuit elements is provided for the second high-speed solenoid 44. These are illustrated schematically in FIG. 3 as the second solenoid driving circuit 57 and the second armature-motion detecting circuit 58.

Each of the armature-motion detecting circuits 47 and 58 may be connected to the controller 41. The controller 41 may be adapted to produce driving signals to one of either of the solenoid driving circuits 45 and/or 57. The controller 41 may use armature motion information of the first high-speed solenoid 42 to trigger initiation of driving voltage for the second high-speed solenoid 44. Conversely, armature motion information of the second high-speed solenoid 44 may be used to trigger initiation of driving voltage for the first high-speed solenoid 42. In this manner coordinated operation of the solenoids 42 and 44 may be achieved.

Figure 4:
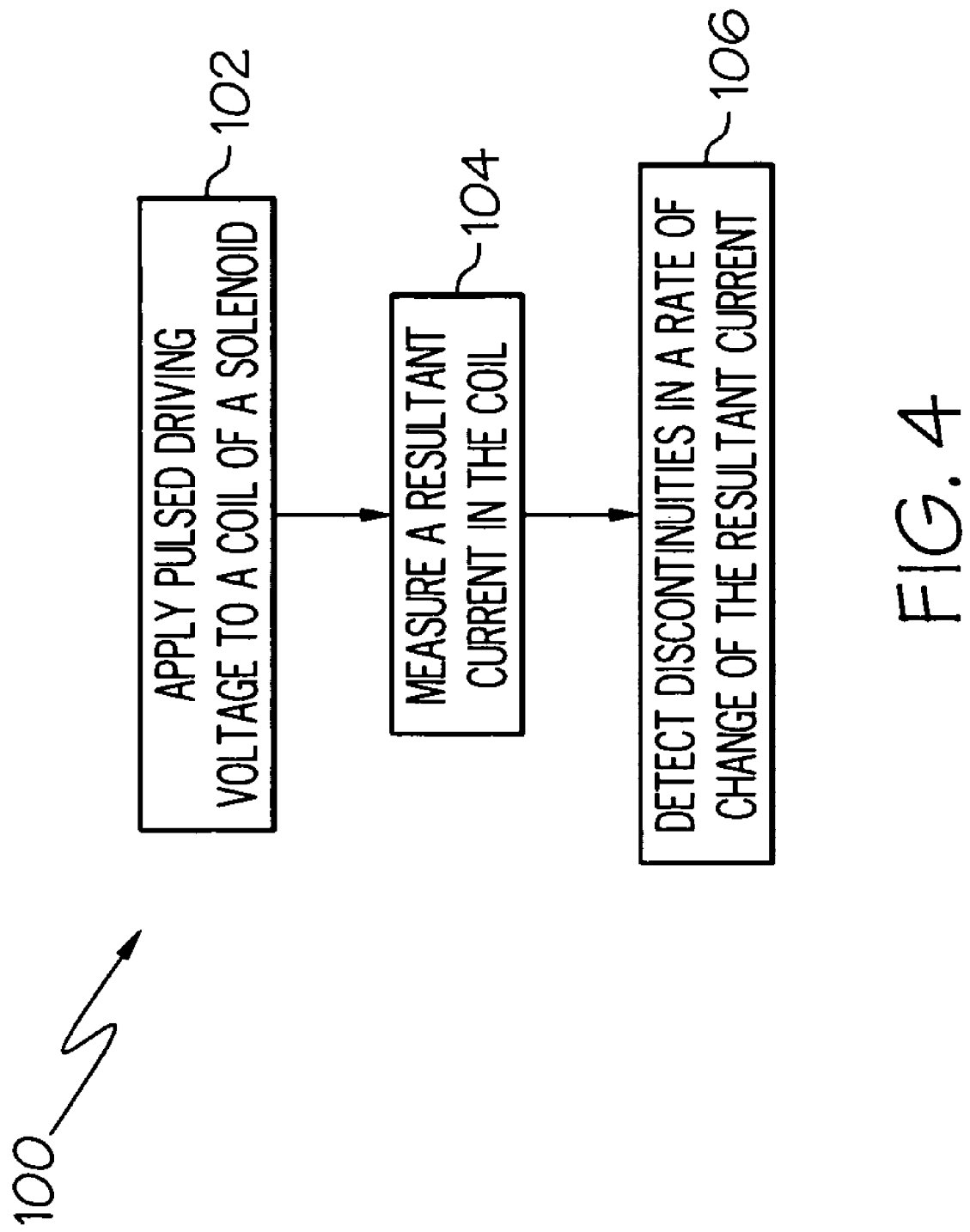
FIG. 4 is a flow chart depicting a method of discerning motion of an armature of a solenoid in accordance with the present invention.

It can be seen that coordination between and among any additional number of solenoids may be readily achieved by assembling a corresponding additional number of driving circuits and motion detecting circuits into the solenoid coordinating The present invention can now be understood to relate to a novel method for detecting motion of solenoid armature. This inventive method, designated by the numeral 100, is illustrated in FIG. 4. The method 100 may comprise a step 102 of applying a pulsed driving voltage to a coil of a solenoid. In a step 104, a resultant current in the coil may be measured. In a step 106, detection of discontinuities in current change rate may be performed.

Figure 5:
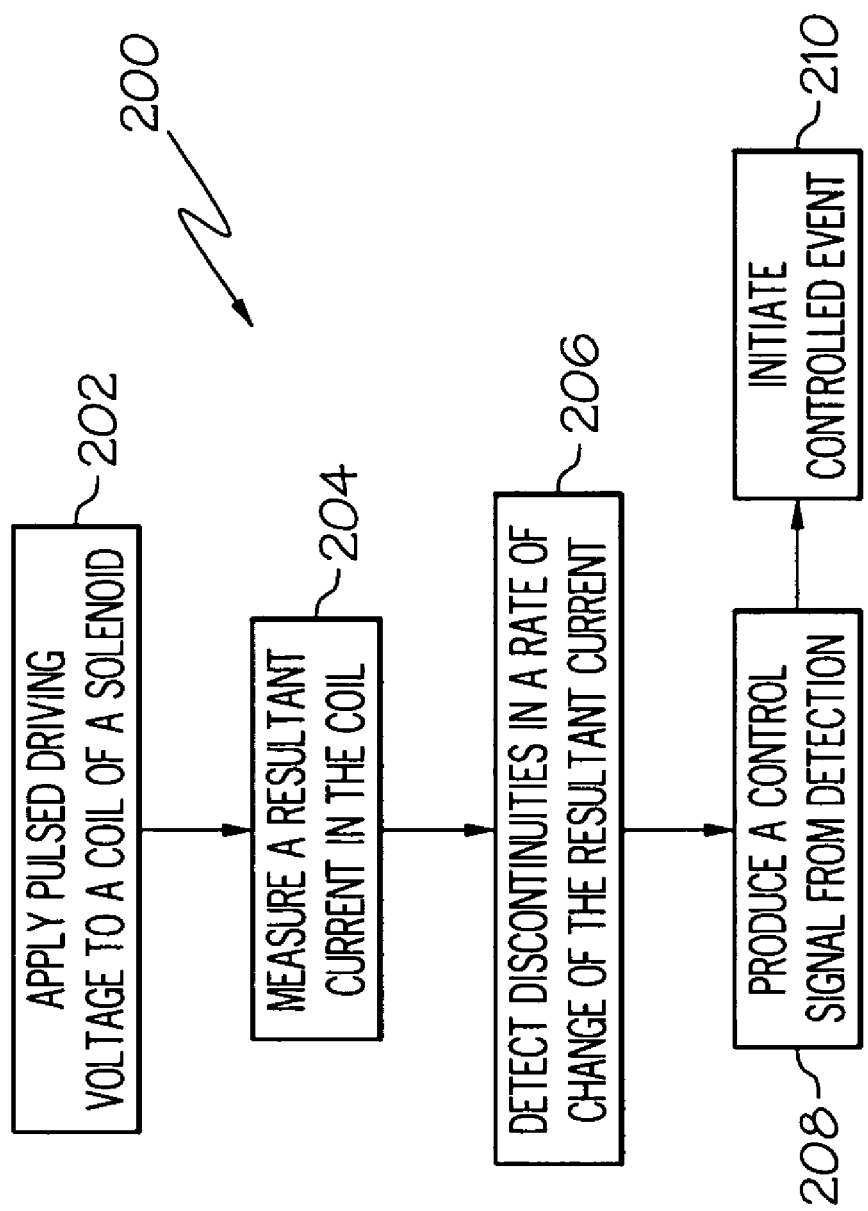
FIG. 5 is a flow chart depicting a method of coordinating operation of a solenoid with a controlled event in accordance with the present invention.

The present invention can also be understood to relate to a novel method for coordinating action of a solenoid with an event. This inventive method, designated by the numeral 200, is illustrated in FIG. 5. The method 200 may comprise a step 202 of applying a pulsed driving voltage to a coil of a solenoid. In a step 204, a resultant current in the coil may be measured. In a step 206, detection of discontinuities in current change rate may be performed. In a step 208 a signal may be produced, which signal may be indicative of detection of a discontinuity and associated armature motion. In a step 210 a coordinated event may be initiated.

Figure 6:
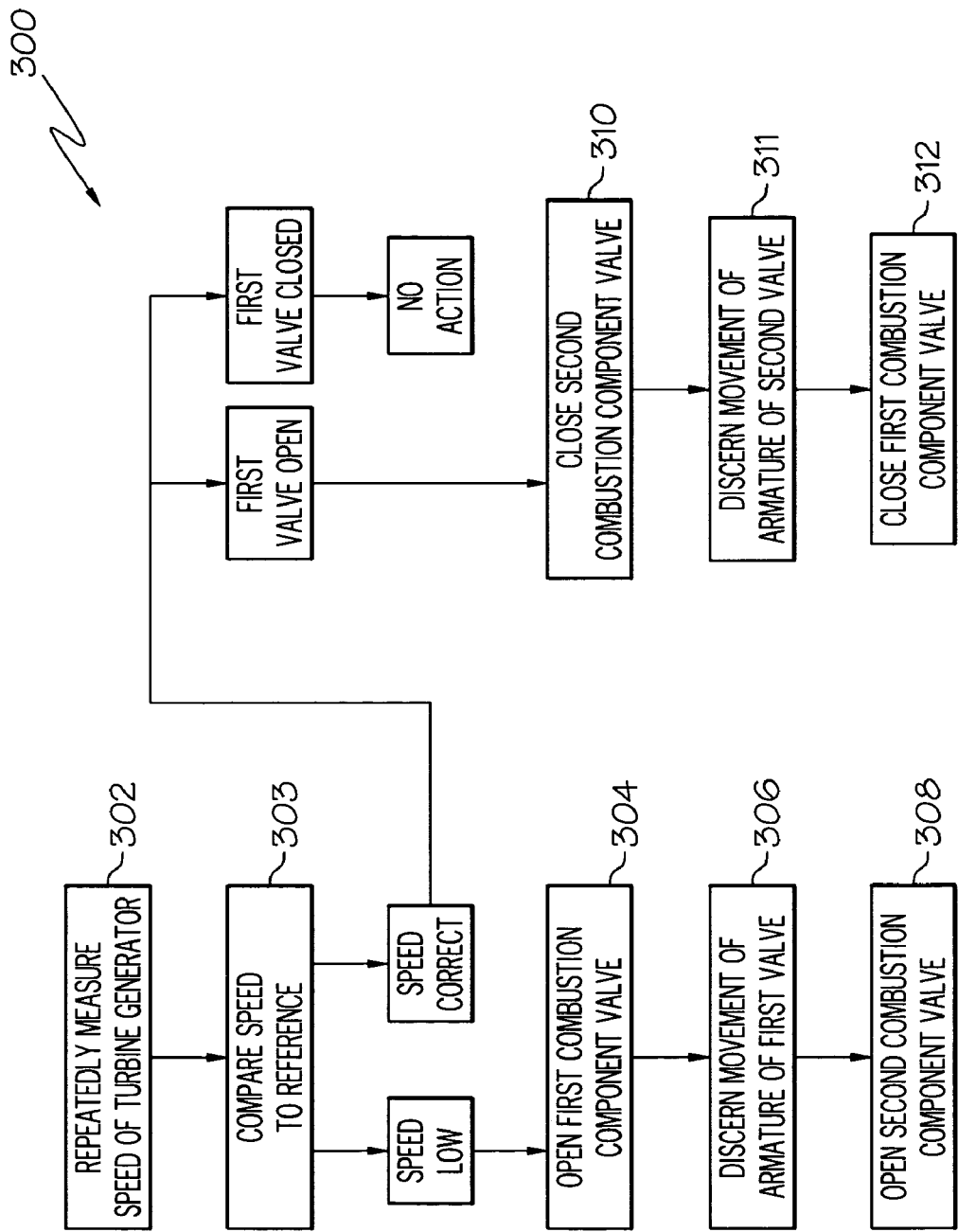
FIG. 6 is a flow chart depicting a method of controlling speed of a turbine generator in accordance with the present invention.

Additionally the present invention can be understood to relate to a novel method for controlling speed of a turbine generator. This inventive method, designated by the numeral 300, is illustrated in FIG. 6. The method 300 may comprise a step 302 of repeatedly measuring a speed of a turbine generator. In a step 303, the speed may be compared to a reference.

If the speed is low, a step 304 may open a first combustion component valve. Opening of the first combustion component valve may be performed by applying a pulsed driving voltage to a coil of a solenoid that actuates the first valve. In a step 306 movement of an armature may be discerned by detecting a discontinuity in current change rate in the coil of the first combustion component valve. In a step 308 a second combustion component valve may then be opened by applying a pulsed driving voltage to a coil of a solenoid that actuates the second valve.

If the compared speed is correct and the first valve is closed, no further action is taken. If the speed is correct and the first valve is open, then a step 310 may performed in which the second combustion valve is closed. In a step 311, motion of an armature of the second valve may be detected and confirmed. This may be followed by a step 312 in which the first combustion component valve may be closed.

It should be understood, of course, that the foregoing relates to exemplary embodiments of the invention and that modifications may be made without departing from the spirit and scope of the invention as set forth in the following claims.

We claim:

1. A coordinated method of operating solenoids comprising the steps of:

applying a pulsed driving voltage to a coil of a first solenoid, the pulsed driving voltage having a frequency of about 5 to about 10 KHz;

measuring a resultant current in the coil; and detecting a first discontinuity in a rate of change of the current, which first discontinuity is produced simultaneously with a first change of speed of an armature of the first solenoid;

releasing the driving voltage from the coil of the first solenoid;

measuring a resultant current in the coil;

detecting a second discontinuity in a rate of change of the current, which second discontinuity is produced simultaneously with a second change of speed of the armature;

producing a coordinating control signal from said detection of either the first or the second discontinuity;

employing the coordinating control signal to actuate a second solenoid within a time period no greater than about 5 milliseconds; and wherein timing of production of the control signal is independent of a rise time or a decay time of current in the coil of the first solenoid.

2. The method of claim 1 which comprises the further step of:

coordinating actuations of the solenoids to control admission of combustion components into a combustion chamber of a turbine generator to control the speed of the turbine generator.

3. The method of claim 2 wherein the combustion components comprise hydrogen and oxygen.

4. A method for coordinating operation of at least a first high-speed solenoid and a second high-speed solenoid with a controllable event comprising the steps of;

applying a pulsed driving voltage to a coil of the first solenoid, the pulsed driving voltage having a frequency at least as high as about 5 KHz;

measuring a resultant current in the coil;

detecting a discontinuity in a rate of change of the current, which discontinuity is produced simultaneously with motion of the armature;

producing a control signal from said detection;

the control signal being produced independently of time lapse between application or removal of a driving voltage and movement of the armature;

employing the control signal to initiate the controllable event;

initiating actuation of a second coil of the second solenoid based on detection of the discontinuity in the rate of change of the current of the first high-speed solenoid; and wherein the actuation is performed within a time period less than about 5 milliseconds.

5. A method for coordinating operation of a first high-speed solenoid with a controllable event comprising the steps of;

applying a pulsed driving voltage to a coil of the first solenoid;

measuring a resultant current in the coil;

detecting a discontinuity in a rate of change of the current, which discontinuity is produced from motion of the armature;

producing a control signal from said detection;

employing the control signal to initiate the controllable event;

detecting a speed of a turbine generator;

comparing the speed to a reference;

opening a first solenoid operated valve to admit a first combustion component into a combustion chamber when the speed is below the reference, the opening being performed by applying a pulsed driving voltage to a solenoid coil of the first valve;

opening a second solenoid operated valve to admit a second combustion component into the combustion chamber after some of the first combustion component is present in the combustion chamber; and coordinating opening of the second valve by discerning motion of a solenoid armature of the first valve, the discernment being performed by detecting a discontinuity in current-change rate in the coil of the first valve.

6. The method of claim 5 which comprises the further steps of:

closing the first solenoid operated valve when the speed reaches the reference, the closing being performed by releasing the pulsed driving voltage from the solenoid coil of the first valve;

closing the second solenoid operated valve after the first valve is closed; and coordinating closing of the second valve by discerning motion of a solenoid armature of the first valve, the discernment being performed by detecting a discontinuity in current-change rate in the coil of the first valve.

7. The method of claim 6 wherein the first combustion component is hydrogen and the second combustion component is oxygen.

8. The method of claim 7 wherein coordination of the valves produces a condition in which oxygen is never present in the combustion chamber without a presence of hydrogen.

* * * * *

UNITED STATES PATENT AND TRADEMARK OFFICE
CERTIFICATE OF CORRECTION

PATENT NO. : 7,595,971 B2  
APPLICATION NO. : 11/153973  
DATED : September 29, 2009  
INVENTOR(S) : Ganev et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 912 days.

Signed and Sealed this

Twenty-eighth Day of September, 2010

David J. Kappos  
*Director of the United States Patent and Trademark Office*